(12) United States Patent
Tan

(10) Patent No.: US 11,527,450 B2
(45) Date of Patent: Dec. 13, 2022

(54) TEG TEST KEY OF ARRAY SUBSTRATE AND DISPLAY PANEL

(71) Applicant: WUHAN CHINA STAR OPTOELECTRONICS TECHNOLOGY CO., LTD., Hubei (CN)

(72) Inventor: Gang Tan, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 247 days.

(21) Appl. No.: 16/765,430

(22) PCT Filed: Apr. 21, 2020

(86) PCT No.: PCT/CN2020/085873
§ 371 (c)(1),
(2) Date: May 19, 2020

(87) PCT Pub. No.: WO2021/196307
PCT Pub. Date: Oct. 7, 2021

(65) Prior Publication Data
US 2022/0115279 A1    Apr. 14, 2022

(30) Foreign Application Priority Data
Apr. 3, 2020  (CN) .......................... 202010257371.3

(51) Int. Cl.
*H01L 27/12*  (2006.01)
*H01L 29/788*  (2006.01)
(Continued)

(52) U.S. Cl.
CPC .......... *H01L 22/34* (2013.01); *H01L 27/1214* (2013.01); *H01L 29/78633* (2013.01)

(58) Field of Classification Search
CPC ......... H01L 22/34; H01L 22/32; H01L 22/30; H01L 27/1214; H01L 27/0207;
(Continued)

(56) References Cited

U.S. PATENT DOCUMENTS 8,895,970 B2 * 11/2014 Kim ..................... H01L 27/124
                                                         257/E51.019
2012/0007628 A1   1/2012 Chiou
(Continued)

FOREIGN PATENT DOCUMENTS

CN           103050060 A        4/2013
CN           103730384 A        4/2014
(Continued)

*Primary Examiner* — Nikolay K Yushin
(74) *Attorney, Agent, or Firm* — PV IP PC; Wei Te Chung; Ude Lu

(57) ABSTRACT

A test element group (TEG) test key of an array substrate and a display panel thereof are provided. The TEG test key of the array substrate includes a glass substrate, a multi-buffer layer, an active layer, a gate insulating layer, a gate electrode layer, an interlayer insulating layer, a source and drain electrode layer, and an organic planarization layer stacked in sequence. The TEG test key of the array substrate is defined with two test zones and a connecting zone, and each test zone is provided with a groove exposing the gate electrode layer. The gate electrode layer in the test zones is electrically connected to the source and drain electrode layer in the connecting zone.

10 Claims, 3 Drawing Sheets

(51) Int. Cl.
*H01L 21/66* (2006.01)
*H01L 29/786* (2006.01)

(58) Field of Classification Search
CPC ............. H01L 27/1104; H01L 27/1116; H01L 29/78633; H01L 29/792; H01L 29/0649; H01L 29/7869
See application file for complete search history.

(56) References Cited

U.S. PATENT DOCUMENTS

2014/0027720 A1    1/2014   Kim et al.
2015/0015296 A1    1/2015   Kim et al.

FOREIGN PATENT DOCUMENTS

| | | |
|---|---|---|
| CN | 104849880 A | 8/2015 |
| CN | 104900674 A | 9/2015 |
| CN | 104992960 A | 10/2015 |
| CN | 105655350 A | 6/2016 |
| CN | 109872983 A | 6/2019 |
| CN | 110112149 A | 8/2019 |
| CN | 110957329 A | 4/2020 |
| JP | 2002207223 A | 7/2002 |
| JP | 2005268611 A | 9/2005 |
| JP | 2009186208 A | 8/2009 |

\* cited by examiner

TEG TEST KEY OF ARRAY SUBSTRATE AND DISPLAY PANEL

FIELD OF INVENTION

The present disclosure relates to the field of display technologies, and more particularly, to a test element group (TEG) test key of an array substrate and a display panel.

BACKGROUND OF INVENTION

Current method for array substrate electrical monitoring is manufacturing a test element group (TEG) test key on a periphery of an array substrate at a same time. By applying a voltage to the array substrate and measuring a square resistance at the TEG test key, a current value can be obtained by dividing the voltage value by the resistance value, and a current value variation curve of the array substrate can be detected. Characteristics such as uniformity of the array substrate can be obtained by a comparative analysis, thereby understanding quality of the array substrate.

Referring to FIG. 1, FIG. 1 is a schematic planar diagram of current TEG test key of an array substrate. The TEG test key of the array substrate 200 includes two test zones 210 and a connecting zone 220 disposed between the two test zones 210. A groove 21 is defined in each of the test zones 210, and a resistance value of the connecting zone 220 can be measured by respectively connecting probes to the grooves 21 in the two test zones 210.

Referring to FIG. 2, FIG. 2 is a schematic partial cross-sectional structural diagram. The test zones 210 include a glass substrate 211, a multi-buffer layer 212, an active layer 213, a gate insulating layer 214, a gate electrode layer 215, an interlayer insulating layer 216, a source and drain electrode layer 217, and an organic planarization layer 218 stacked in sequence. The connecting zone 220 further includes an indium tin oxide layer 219 disposed on the organic planarization layer 218. Wherein, the source and drain electrode layer 217 and the indium tin oxide layer 219 are interlacingly disposed at intervals and achieve an electrical connection through through-holes 22 penetrating through the organic planarization layer 218.

Referring to FIGS. 1 and 2, the grooves 21 are generally rectangular, and the grooves 21 penetrate through the organic planarization layer 218 and expose the source and drain electrode layer 217. However, the organic planarization layer 218 in the current TEG test key of the array substrate 200 is prone to peeling off at an outer boundary of the grooves 21, thereby making the TEG test key of the array substrate 200 abnormal and unable to be used for monitoring.

Technical problem: an objective of the present disclosure is to provide a TEG test key of an array substrate and a display panel to solve technical problems of an organic planarization layer prone to peeling off at boundaries, making the TEG test key of the array substrate abnormal and unable to be used for monitoring in current technology, thereby ensuring that the TEG test key of the array substrate is normal.

SUMMARY OF INVENTION

In order to solve the above problems, an embodiment of the present disclosure provides a test element group (TEG) test key of an array substrate which includes a glass substrate, a multi-buffer layer, an active layer, a gate insulating layer, a gate electrode layer, an interlayer insulating layer, a source and drain electrode layer, and an organic planarization layer stacked in sequence. Wherein, the TEG test key of the array substrate is defined with two test zones and a connecting zone disposed between the two test zones. Each test zone has a groove penetrating through the organic planarization layer, the source and drain electrode layer, and the interlayer insulating layer, and exposing the gate electrode layer. The gate electrode layer in the test zones extends toward the connecting zone and is electrically connected to the source and drain electrode layer in the connecting zone.

Further, the gate electrode layer in the test zones is electrically connected to the source and drain electrode layer in the connecting zone through a plurality of first through-holes penetrating through the interlayer insulating layer.

Further, the source and drain electrode layer in the connecting zone is disposed at intervals, an indium tin oxide layer is disposed on the source and drain electrode layer, the indium tin oxide layer and the source and drain electrode layer are interlacingly disposed at intervals and partially overlapped, and the indium tin oxide layer and the source and drain electrode layer achieve an electrical connection through second through-holes penetrating through the organic planarization layer at overlapped positions.

Further, a width of the connecting zone is less than widths of the test zones.

Further, the multi-buffer layer includes a light-shielding layer, a first buffer layer, and a second buffer layer disposed in a stack. The light-shielding layer is disposed opposite to the active layer, the first buffer layer is disposed on the light-shielding layer and totally covers the light-shielding layer, and the second buffer layer is disposed on the first buffer layer.

Further, a material for the first buffer layer comprises SiNx.

Further, a material for the second buffer layer comprises SiOx.

Further, a material for the gate insulating layer comprises SiOx.

Further, a material for the interlayer insulating layer comprises SiNx or SiOx.

An embodiment of the present disclosure further provides a display panel which comprises the TEG test key of the array substrate and the array substrate, and the test zones of the TEG test key of the array substrate are electrically connected to the array substrate.

Beneficial effect: the beneficial effect of the present disclosure is that a test element group (TEG) test key of an array substrate and a display panel thereof are provided by extending a gate electrode layer in test zones to achieve an electrical connection with a source and drain electrode layer in a connecting zone, which substitutes for current technology which extends the source and drain electrode layer in the test zones to achieve an electrical connection with an indium tin oxide layer in the connecting zone, thereby increasing a thickness of film layers on an electrical connecting part of the connecting zone to the test zones. That is, the film layers are increased from an organic planarization layer on the source and drain electrode layer in the current technology to an interlayer insulating layer, the source and drain electrode layer, and the organic planarization layer on the gate electrode layer, which prevents peeling at boundaries thereof, thereby ensuring that the TEG test key of the array substrate is normal and preventing abnormal phenomena in monitoring.

Figure 1:
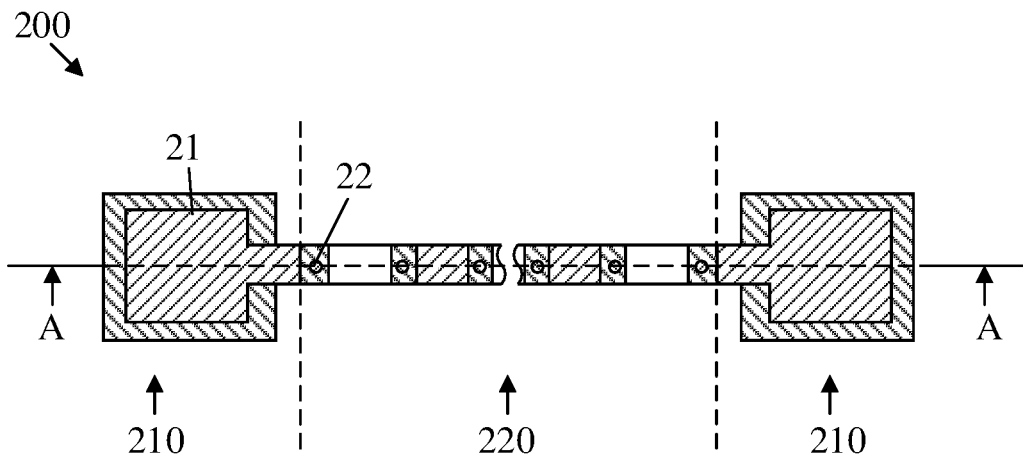
FIG. 1 is a schematic planar diagram of a TEG test key of an array substrate in current technology.
Figure 2:
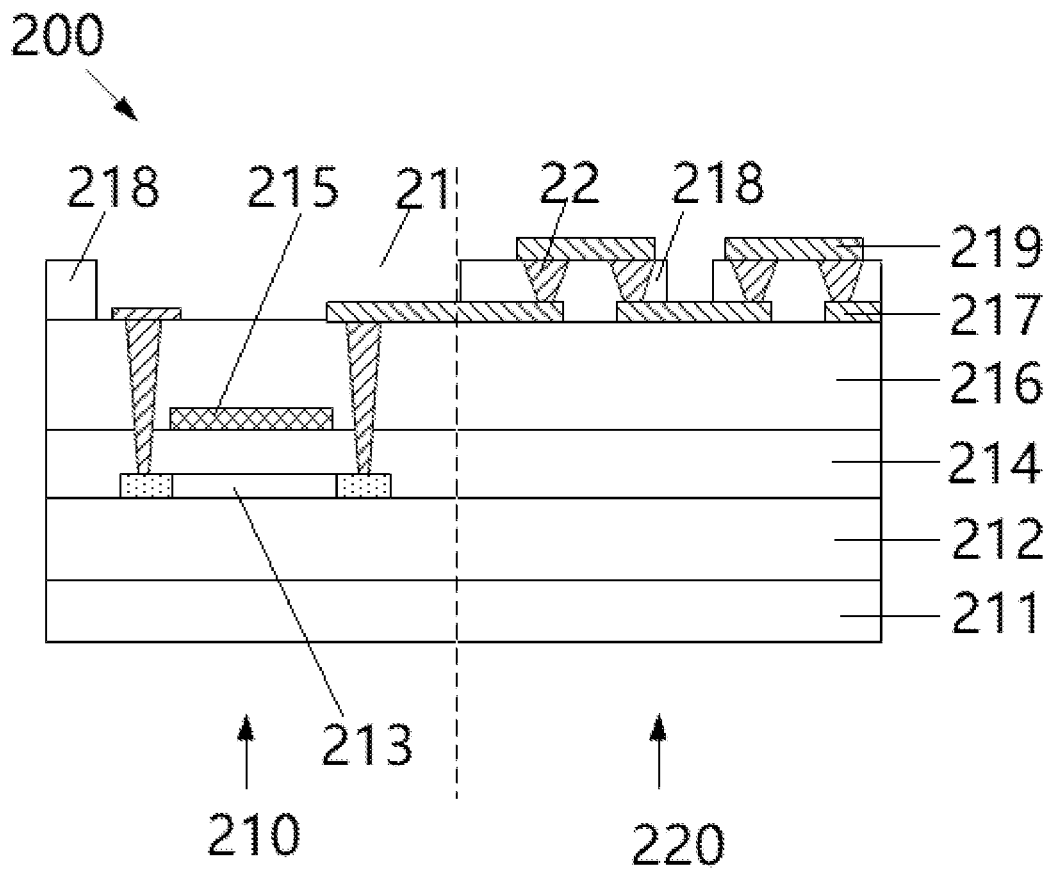
FIG. 2 is a schematic partial cross-sectional structural diagram of the TEG test key of the array substrate shown in FIG. 1 along A-A direction.

Elements in the drawings are designated by reference numerals listed below.

100. TEG test key of an array substrate; 10. test zone; 20. connecting zone; 11. glass substrate; 12. multi-buffer layer; 13. active layer; 14. gate insulating layer; 15. gate electrode layer; 16. interlayer insulating layer; 17. source and drain electrode layer; 18. organic planarization layer; 19. indium tin oxide layer; 101. groove; 201. first through-hole; 202. second through-hole; 121. light-shielding layer; 122. first buffer layer; 123. second buffer layer.

DETAILED DESCRIPTION OF PREFERRED EMBODIMENTS

In the description of the present disclosure, it should be understood that terms such as "center", "longitudinal", "lateral", "length", "width", "thickness", "upper", "lower", "front", "rear", "left", "right", "vertical", "horizontal", "top", "bottom", "inside", "outside", "clockwise", "counterclockwise", as well as derivative thereof should be construed to refer to the orientation as described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or implicitly indicating the number of technical features indicated. Thus, features limited by "first" and "second" are intended to indicate or imply including one or more than one these features. In the description of the present disclosure, "a plurality of" relates to two or more than two, unless otherwise specified.

Figure 3:
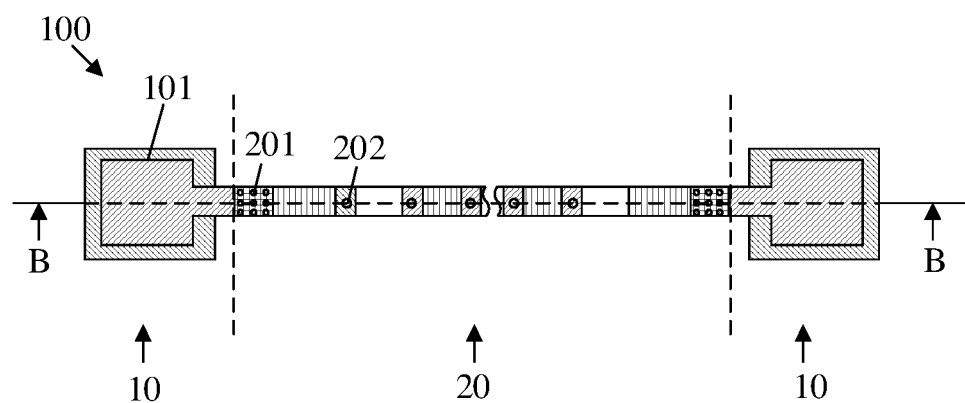
FIG. 3 is a schematic planar diagram of a TEG test key of an array substrate according to an embodiment of the present disclosure.
Figure 4:
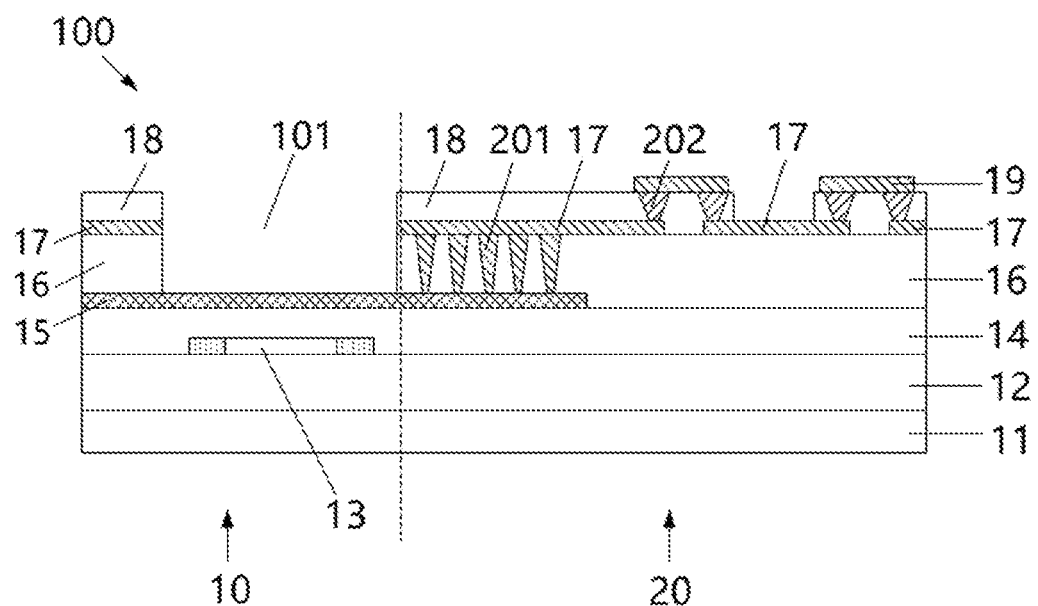
FIG. 4 is a schematic partial cross-sectional structural diagram of the TEG test key of the array substrate shown in FIG. 3 along B-B direction.

Referring to FIGS. 3 and 4, in an embodiment of the present disclosure, a TEG test key of an array substrate 100 includes a glass substrate 11, a multi-buffer layer 12, an active layer 13, a gate insulating layer 14, a gate electrode layer 15, an interlayer insulating layer 16, a source and drain electrode layer 17, and an organic planarization layer 18 stacked in sequence. Wherein, the TEG test key of the array substrate 100 is defined with two test zones 10 and a connecting zone 20 disposed between the two test zones 10. Each test zone 10 has a groove 101 penetrating through the organic planarization layer 18, the source and drain electrode layer 17, and the interlayer insulating layer 16, and exposing the gate electrode layer 15. The gate electrode layer 15 in the test zones 10 extends toward the connecting zone 20 and is electrically connected to the source and drain electrode layer 17 in the connecting zone 20.

In the embodiment, the gate electrode layer 15 in the test zones 10 achieves an electrical connection to the source and drain electrode layer 17 in the connecting zone 20 through a plurality of first through-holes 201 penetrating through the interlayer insulating layer 16.

As shown in FIG. 4, the source and drain electrode layer 17 in the connecting zone 20 is disposed at intervals, an indium tin oxide layer 19 is disposed on the source and drain electrode layer 17, the indium tin oxide layer 19 and the source and drain electrode layer 17 are interlacingly disposed at intervals and partially overlapped, and the indium tin oxide layer 19 and the source and drain electrode layer 17 achieve an electrical connection through second through-holes 202 penetrating through the organic planarization layer 18 at overlapped positions. The connecting zone 20 has a wiring having a predetermined resistance consisting of a plurality of repeating units to connect the test zones 10 at two ends of the connecting zone 20. Each repeating unit all consists of the indium tin oxide layer 19 connecting to the source and drain electrode layer 17 through the second through-holes 202 at the overlapped positions. There is a larger resistance value at the second through-holes 202, a resistance value of each repeating unit can be obtained by measuring a resistance value of the connecting zone 20 and dividing by a number of the repeating units, and a measuring method thereof is the current technology, which is not repeated herein.

In the embodiment, a width of the connecting zone 20 is less than widths of the test zones 10.

In the embodiment, a width of one side of the grooves 101 in the test zones 10 toward the connecting zone 20 is equal to the width of the connecting zone 20. The grooves 101 are roughly rectangular and are used to connect to probes to measure the resistance value of the connecting zone 20. The width of the side of the grooves 101 on the gate electrode layer 15 extending from the test zones 10 toward the connecting zone 20 becomes narrow to form a connecting end, and a width of the connecting end is equal to the width of the connecting zone 20.

Figure 5:
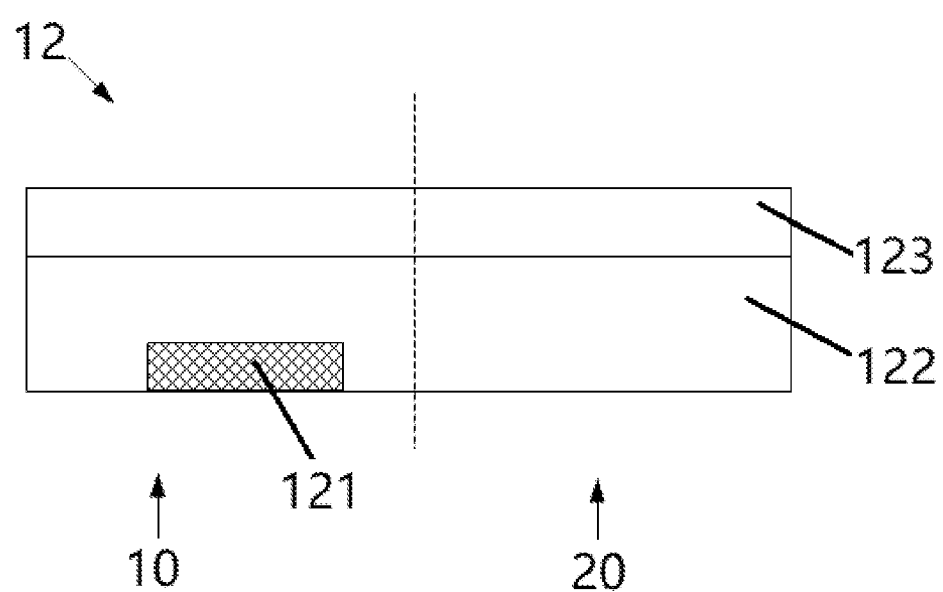
FIG. 5 is a schematic structural diagram of a multi-buffer layer of a TEG test key of an array substrate according to an embodiment of the present disclosure.

Referring to FIG. 5, the multi-buffer layer 12 includes a light-shielding layer 121, a first buffer layer 122, and a second buffer layer 123 disposed in a stack. Specifically, the light-shielding layer 121 is disposed opposite to the active layer 13, the first buffer layer 122 is disposed on the light-shielding layer 121 and totally covers the light-shielding layer 121, and the second buffer layer 123 is disposed on the first buffer layer 122.

In the embodiment, a material for the first buffer layer comprises SiNx.

In the embodiment, a material for the second buffer layer comprises SiOx.

In the embodiment, a material for the gate insulating layer 14 comprises SiOx.

In the embodiment, a material for the interlayer insulating layer 16 comprises SiNx or SiOx. The interlayer insulating layer 16 may be one layer or multiple layers, and a disposing method of a multi-layered interlayer insulating layer 16 is alternatingly disposing a SiNx layer and a SiOx layer.

An embodiment of the present disclosure further provides a display panel which comprises the TEG test key of the array substrate 100 and the array substrate (which is not shown in the figure), and the test zones 10 of the TEG test key of the array substrate 100 are electrically connected to the array substrate. Wherein, structures of the test zones 10 and the display panel can be manufactured at a same time.

It should be noted that the gate electrode layer 15 in the test zones 10 and the gate electrode layer 15 in a display area of the display panel are not connected to each other. The gate electrode layer 15 in the test zones 10 only has an induction effect of the TEG test key of the array substrate 100. In addition, manufacturing the gate electrode layer 15 in the test zones 10 can effectively increase a thickness of film layers surrounding the grooves 101 in the test zones 10, which prevents boundaries thereof from peeling off, and the resistance value of the connecting zone 20 can be measured by the gate electrode layer 15 exposed in the grooves 101 being electrically connected to an external device.

When in use, a voltage U can be applied to the display panel where the TEG test key of the array substrate 100 is located, and the gate electrode layer 15 exposed in the grooves 101 in the two test zones 10 are respectively connected to probes to measure the resistance value R of the connecting zone 20. A current I passing through the TEG test key of the array substrate 100, that is, the current I passing through the display panel where the TEG test key of the array substrate 100 is located, can be obtained by calculating U/R. By analyzing a curve of the current I changing with time and comparing with a standard change curve, whether change of the current I passing through the display panel is normal can be known. Especially by comparing a maximum trend value of the current I, it can be inferred whether uniformity of the array substrate of the display panel is good, thereby determining the service life of the display panel. In addition, the resistance value R is a square resistance, and a measuring method thereof is a current technology, which will not be repeated here. A thickness range of the panel can also be calculated and obtained through the resistance value R, and it is also a current technology, which will not be repeated here.

When measuring the resistance value R of the connecting zone 20, an existing measuring result ranges from 45 Ω/cm2 to 65 Ω/cm2, and a measuring result range of the embodiment of the present disclosure is increased by 0.8 Ω/cm2 to 1.2 Ω/cm2 on a basis of 45 Ω/cm2 to 65 Ω/cm2. Since an area of the TEG test key of the array substrate 100 is very small relative to an area of the display panel, an added resistance thereof is negligible. Therefore, other related devices are not necessary to be adjusted, thereby having strong utility.

The beneficial effect of the present disclosure is that a test element group (TEG) test key of an array substrate and a display panel thereof are provided by extending a gate electrode layer in test zones to achieve an electrical connection with a source and drain electrode layer in a connecting zone, which substitutes for current technology which extends the source and drain electrode layer in the test zones to achieve an electrical connection with an indium tin oxide layer in the connecting zone, thereby increasing a thickness of film layers on an electrical connecting part of the connecting zone to the test zones. That is, the film layers are increased from an organic planarization layer on the source and drain electrode layer in the current technology to an interlayer insulating layer, the source and drain electrode layer, and the organic planarization layer on the gate electrode layer, which prevents peeling at boundaries thereof, thereby ensuring that the TEG test key of the array substrate is normal and preventing abnormal phenomena in monitoring.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. A test element group (TEG) test key of an array substrate, comprising a glass substrate, a multi-buffer layer, an active layer, a gate insulating layer, a gate electrode layer, an interlayer insulating layer, a source and drain electrode layer, and an organic planarization layer stacked in sequence;
    wherein the TEG test key of the array substrate is defined with two test zones and a connecting zone disposed between the two test zones;
    each test zone has a groove penetrating through the organic planarization layer, the source and drain electrode layer, and the interlayer insulating layer, and exposing the gate electrode layer; and
    the gate electrode layer in the test zones extends toward the connecting zone to be disposed in the test zones and the connecting zone and is electrically connected to the source and drain electrode layer in the connecting zone.

2. The TEG test key of the array substrate according to claim 1, wherein the gate electrode layer in the test zones achieves an electrical connection to the source and drain electrode layer in the connecting zone through a plurality of first through-holes penetrating through the interlayer insulating layer.

3. The TEG test key of the array substrate according to claim 1,
    wherein the source and drain electrode layer in the connecting zone is disposed at intervals, an indium tin oxide layer is disposed on the source and drain electrode layer, the indium tin oxide layer and the source and drain electrode layer are interlacingly disposed at intervals and partially overlapped, and the indium tin oxide layer and the source and drain electrode layer achieve an electrical connection through second through-holes penetrating through the organic planarization layer at overlapped positions.

4. The TEG test key of the array substrate according to claim 1, wherein a width of the connecting zone is less than widths of the test zones.

5. The TEG test key of the array substrate according to claim 1, wherein a material for the gate insulating layer comprises SiOx.

6. The TEG test key of the array substrate according to claim 1, wherein a material for the interlayer insulating layer comprises SiNx or SiOx.

7. A display panel, comprising the TEG test key of the array substrate according to claim 1 and the array substrate, wherein the test zones of the TEG test key of the array substrate are electrically connected to the array substrate.

8. The TEG test key of the array substrate according to claim 1,
    wherein the multi-buffer layer comprises:
    a light-shielding layer disposed opposite to the active layer;
    a first buffer layer disposed on the light-shielding layer and totally covering the light-shielding layer; and
    a second buffer layer disposed on the first buffer layer.

9. The TEG test key of the array substrate according to claim 8, wherein a material for the first buffer layer comprises SiNx.

10. The TEG test key of the array substrate according to claim 8, wherein a material for the second buffer layer comprises SiOx.

* * * * *